(12) United States Patent
Brown et al.

(10) Patent No.: US 6,955,931 B1
(45) Date of Patent: Oct. 18, 2005

(54) METHOD FOR DETECTING SILICIDE ENCROACHMENT OF A GATE ELECTRODE IN A SEMICONDUCTOR ARRANGEMENT

(75) Inventors: David E. Brown, Pleasant Valley, NY (US); Sey-Ping Sun, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/053,863

(22) Filed: Feb. 10, 2005

(51) Int. Cl.[7] .............................................. H01L 21/66
(52) U.S. Cl. ........................ 438/16; 438/682; 438/683
(58) Field of Search ........................ 438/16, 682, 683, 438/FOR 142; 257/E21.522

(56) References Cited

U.S. PATENT DOCUMENTS

| | | | |
|---|---|---|---|
| 5,780,361 A * | 7/1998 | Inoue | 438/683 |
| 5,780,362 A * | 7/1998 | Wang et al. | 438/683 |
| 6,048,791 A * | 4/2000 | Katata et al. | 438/655 |
| 6,251,779 B1 * | 6/2001 | Lu et al. | 438/682 |
| 6,734,099 B2 * | 5/2004 | Zhao et al. | 438/656 |
| 6,787,464 B1 * | 9/2004 | Cheek et al. | 438/683 |
| 6,790,683 B1 * | 9/2004 | Markle et al. | 438/8 |
| 2001/0041431 A1 * | 11/2001 | Scott et al. | 438/527 |
| 2002/0151170 A1 * | 10/2002 | Maex et al. | 438/638 |
| 2003/0003611 A1 * | 1/2003 | Weiner et al. | 438/16 |
| 2003/0077890 A1 * | 4/2003 | Trivedi et al. | 438/592 |
| 2004/0092045 A1 * | 5/2004 | Bultman et al. | 438/16 |

* cited by examiner

Primary Examiner—George Fourson

(57) ABSTRACT

A method of detecting silicide encroachment to the sidewalls of a gate electrode includes forming silicide at a device, with sidewall spacers defining a desired separation of the silicide from the sidewalls of the gate electrode. After silicide formation, the sidewall spacers are removed and line-of-sight monitoring is performed of the region previously obscured by the sidewall spacers, thereby permitting detection of silicide encroachment.

17 Claims, 2 Drawing Sheets

METHOD FOR DETECTING SILICIDE ENCROACHMENT OF A GATE ELECTRODE IN A SEMICONDUCTOR ARRANGEMENT

FIELD OF THE INVENTION

The present invention relates to manufacturing semiconductor devices, and more particularly, to the formation of silicide and detection of silicide encroachment in semiconductor arrangements.

BACKGROUND OF THE INVENTION

As feature sizes of metal-oxide-semiconductor (MOS) and complementary metal-oxide-semiconductor (CMOS) devices are reduced into the deep sub-micron range, so-called "short-channel" effects arise which tend to limit device performance. Deep junctions, as provided in PMOS devices, and high-on resistance, are problematic for voltages less than 2V.

For P-channel MOS transistors of short-channel type, the major limitation on performance arises from "punch-through" effects which occur with relatively deep junctions. In such instances, there is a wider sub-surface depletion effect and it is easier for the field lines to extend from the drain region to the source region, resulting in the above-mentioned "punch-through" current problems and device shorting. To minimize this effect, relatively shallow junctions are employed in forming P-channel MOS transistors. The most satisfactory solution to date of hot carrier instability problems of MOS devices is the provision of shallow source/drain extensions driven just under the gate electrode region, while the heavily-doped drain region is laterally displaced away from the gate by use of a sidewall spacer on side surfaces of the gate electrode. Such structures are particularly advantageous in avoiding large lateral diffusion, and the channel length can be set precisely.

In order to reduce contact resistance and increase device speed, metal silicide layers are conventionally formed on source/drain regions. As device geometries continue to plunge into deep sub-micron range, the need to accurately control the thickness of sidewall spacers formed on side surfaces of gate electrodes becomes increasingly significant. For example, a gate electrode may be formed over a semiconductor substrate with a gate dielectric layer therebetween and the sidewall spacers on side surfaces thereof. The sidewall spacers can comprise silicon oxide, a silicon nitride or a silicon oxynitride, for example. Shallow source/drain extensions are typically formed using the gate electrode as a mask prior to forming these sidewall spacers.

Subsequently, ion implantation is typically conducted using the gate electrode and sidewall spacers as a mask to form moderately- or heavily-doped and deeper source/drain regions. The thickness of the sidewall spacers is significant in at least two respects. Initially, the thickness of the sidewall spacer controls the length of the shallow source/drain extension. In addition, the width of the sidewall spacers controls the distance between the metal silicide layers and the side surfaces of the gate electrode.

Silicide, such as nickel silicide, can encroach on the polysilicon gate electrode by lateral diffusion underneath the sidewall spacers. If the encroachment is large enough, the device is rendered unusable. It is therefore desirable to detect encroachment of the silicide on the polysilicon gate electrode. Detection of the potential encroachment is difficult by electrical testing. One problem with electrical testing is that the wafer has to be processed to metal 1 (M1) before the electrical testing can be performed. This is wasteful of processing steps if the silicide encroachment has already rendered the part unusable. Furthermore, since the silicide encroachment occurs underneath the spacer material, the encroachment cannot be detected by optical or electron microscope analysis. These limitations have previously rendered silicide encroachment practically undetectable.

SUMMARY OF THE INVENTION

There is a need for a method of detecting the encroachment of silicide of a gate electrode in a semiconductor arrangement in a manner that assures proper detection and is production worthy.

These and other needs are met by embodiments of the present invention which provide a method of detecting silicide encroachment of a gate electrode in a semiconductor arrangement comprising the steps of removing sidewall spacers on the gate electrode and a substrate, and performing line-of-sight monitoring of the substrate, after removal of the sidewall spacers, to detect silicide encroachment.

By removing the sidewall spacers from the gate electrode and the substrate, in accordance with embodiments of the invention, the way is cleared for performing line of sight monitoring of the substrate. This permits optical monitoring or electron microscope monitoring, for example, to be employed. When silicide encroachment is detected, unnecessary processing in the back end of the line (BEOL) can be avoided, if the encroachment is so great that the part would be unusable. This creates a cost saving in the manufacturing process.

The earlier stated needs are met by other aspects of the present invention that provide a method of manufacturing a semiconductor device comprising the steps of forming a gate electrode on a substrate and forming removable sidewalls spacers on the gate electrode and the substrate. Silicide is formed on the substrate, the sidewall spacers defining an offset of the silicide from the gate electrode. The sidewall spacers are removed to expose the substrate. Line-of-sight monitoring of the exposed substrate is performed to detect silicide encroachment.

The earlier stated needs are also met by other aspects of the present invention which provide a method of monitoring a semiconductor arrangement. The method comprises the steps of forming silicide regions in a substrate, the silicide regions being offset from a gate electrode. The substrate is exposed at regions adjacent to the gate electrode. Line-of-sight monitoring of the exposed substrate regions is performed to determine an amount of offset of the silicide regions from the gate electrode.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the detection of silicide encroachment of a gate electrode in a semiconductor arrangement, and in particular, to the obscuring of the silicide encroachment by sidewall spacers. This is achieved, at least in part, by the provision of the present invention for removal of sidewall spacers from the sidewalls of the gate electrode and from the substrate following silicide formation. This is followed by line-of-sight monitoring which can include either optical monitoring or electron microscope monitoring, for example. The observation allows for reliable detection of silicide encroachment. If the encroachment is so large that the device is unusable, further processing in the BEOL can be avoided, providing an overall cost savings.

Figure 1:
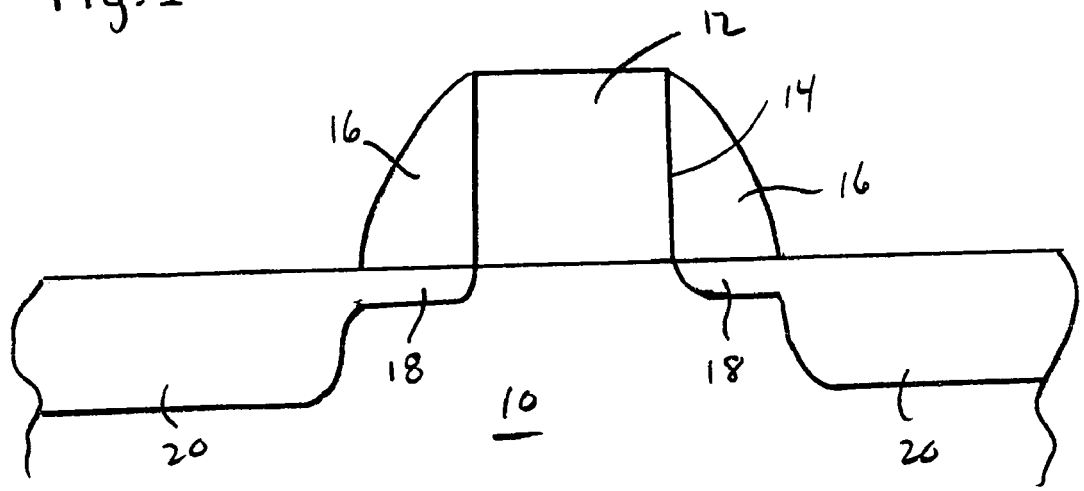
FIG. 1 is a schematic depiction of a cross-sectional view of a semiconductor device during one phase of manufacture in accordance with embodiments of the present invention.

FIG. 1 schematically depicts a cross-section of a semiconductor device during one phase of manufacturing in accordance with embodiments of the present invention. On a substrate 10, such as a silicon substrate, for example, a gate electrode 12 is provided. On the sidewalls 14 of the gate electrode 12 are formed sidewall spacers 16 by conventional methodologies.

In exemplary embodiments, the gate electrode 12 is made of polysilicon, for example, or other suitable material such as metal, silicide, etc. Similarly, the sidewall spacers 16 are made of a suitable material, such as silicon oxide, silicon nitride, silicon oxynitride, etc. As will be appreciated from the following description, the sidewall spacers 16 need to be made of material that is readily removable without damaging silicide or the gate electrode material.

Source and drain extensions 18 are formed by conventional ion implantation after the formation of the gate electrode 12, but prior to the formation of the sidewalls spacer 16. Formation of the source/drain extensions 18 can be accomplished by conventional ion implantation techniques and dosing amounts. Once the sidewall spacers 16 are formed, a heavier doping is performed to create the source and drain regions 20. The sidewall spacer 16 and the gate electrode 12 serve to mask the substrate during the heavy or moderate doping processes.

Figure 2:
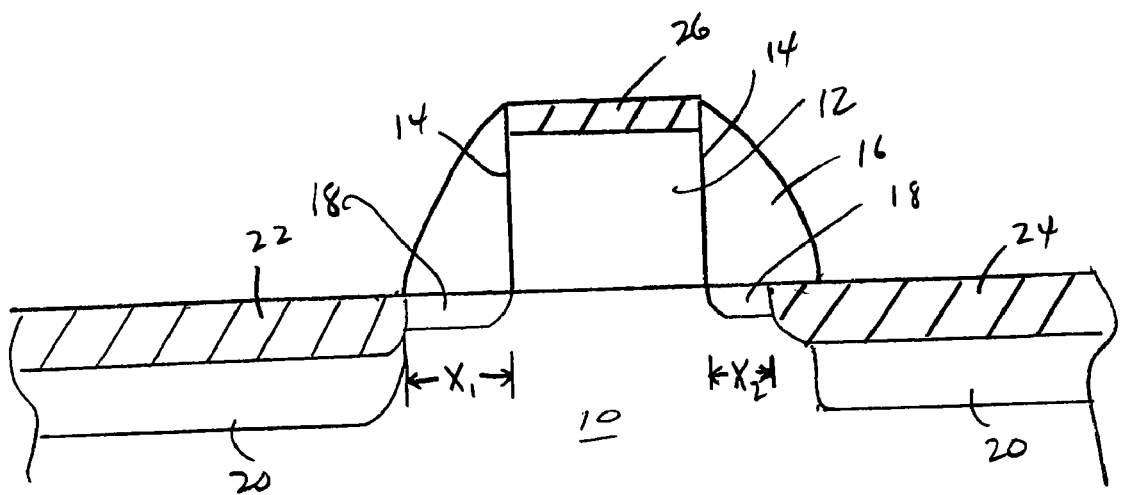
FIG. 2 depicts the arrangement of FIG. 1 following the formation of silicide in accordance with embodiments of the present invention.

In FIG. 2, a silicide process has been performed that creates silicide regions 22, 24 in the source and drain regions 20, respectively, and a silicide region 26 in the gate electrode 12. Sidewall spacers 16 prevent formation of the silicide on the gate electrode 12, and the spacers 16 also initially precisely define the separation of the silicide regions 22, 24 from the gate electrode 12. A typical silicide process includes the blanket deposition of a refractory metal, such as nickel, platinum, titanium, tungsten, etc., on the semiconductor wafer. An annealing process is performed that causes the silicide to form at the interface of the refractory metal and silicon.

It is desired that the silicide be located at a precise distance from the gate electrode 12. In the embodiment of FIG. 2, this distance is $X_1$. The silicide region 22 in FIG. 2 is at this distance $X_1$. However, due to lateral diffusion, it is possible for the silicide to encroach toward the sidewalls 14 of the gate electrode 12. In FIG. 2, this is depicted as the encroachment of silicide region 24 towards the sidewall 14 of the gate electrode 12. Hence, the distance $X_2$, which is the distance from the left-most edge of the silicide region 24 to the right sidewall of the gate electrode 12, is less than the desired distance $X_1$ (i.e., $X_2 < X_1$). This encroachment may be so great that the part becomes unusable. In such a case, if further processing occurs, the part will ultimately have to be discarded and the processing steps that followed the formation of silicide will have been wasted, increasing expense. It is therefore preferable to detect the encroachment of silicide at an earlier stage. However, detecting encroachment by electrical testing is difficult and can only be done after processing to metal 1 (M1), and the spacers obscure a direct line-of-sight measurement.

Figure 3:
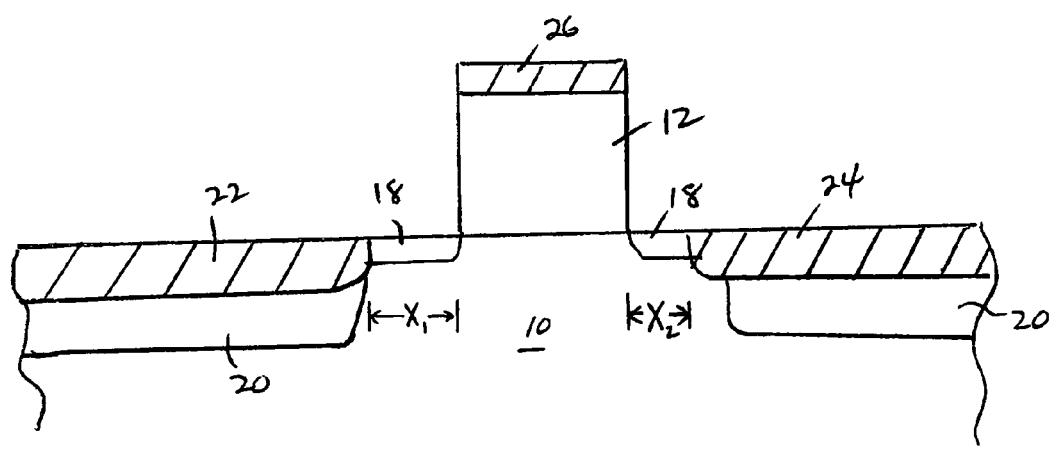
FIG. 3 depicts the arrangement of FIG. 2 after the sidewall spacers are removed in accordance with embodiments of the present invention.

In the method of the present invention depicted in FIG. 3, the sidewall spacers 16 are removed by an appropriate etching technique, suitable for the material used in the sidewalls spacers 16. A wet etching or dry etching may be employed, as appropriate, to complete remove the sidewall spacers 16. The sidewall spacers 16 may be safely removed at this time, since the sidewall spacers 16 have been employed to define the offset of the silicide from the gate edge, and have also already been employed in the doping process. The removal of the sidewall spacers 16 do not impact the device at this point in the flow.

Following the removal of the sidewall spacers 16, as depicted in FIG. 3, a line-of-sight monitoring can now be performed to detect the silicide encroachment. The examples of line-of-sight monitoring techniques include optical monitoring or electron microscope monitoring, for example. This achievable since the sidewall spacers 16 no longer obscure the substrate 10 directly adjacent to the gate electrode 12. Hence, with this approach, the observation may be made in FIG. 4 that the silicide region 24 has undesirably encroached upon the sidewall 14 of the gate electrode 12. It is to be noted that the depiction of FIGS. 3 and 4 of encroachment and no encroachment need not occur on the same gate, but is depicted in this manner for simplicity of explanation.

Figure 4:
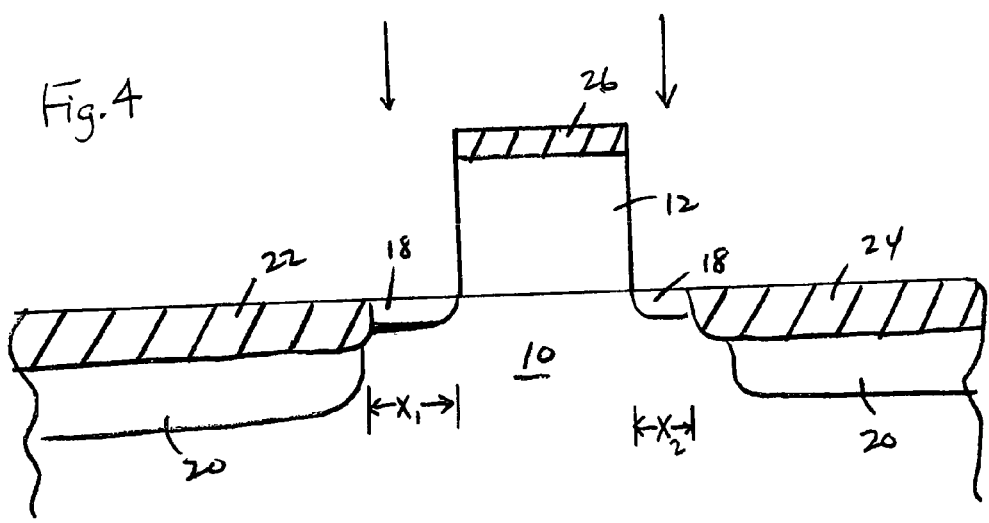
FIG. 4 shows the arrangement of FIG. 3 during an observational phase in order to detect silicide encroachment in accordance with embodiments of the present invention.

In the case of FIG. 4, if the device is considered unusable by the line-of-sight monitoring, further processing may be avoided, thereby providing a cost savings. Another benefit of the present invention is that the removal of the sidewall spacers 16 enables bringing nitride etch shop layers for a contact inter-layer dielectric closer to the gate electrode 12, in the steps following silicide formation. Recent developments employ stressed nitride etch stop layers to enhance channel mobility in NMOS and PMOS devices by proper stress tuning.

Although, the present invention has been described and illustrated in detail, it is to be clearly understood that the same is by way of illustration and example only and is not to be taken by way of limitation, the scope of the present invention being limited only by the terms of the appended claims

What is claimed is:

1. A method of detecting silicide encroachment of a gate electrode in a semiconductor arraignment, comprising the steps:

removing sidewall spacers on the gate electrode and a substrate; and performing line-of-sight monitoring of the substrate, after removal of the sidewall spacers, to detect silicide encroachment.

2. The method of claim 1, wherein the line-of-sight monitoring is optical monitoring.

3. The method of claim 1, wherein the line-of-sight monitoring is optical monitoring.

4. The method of claim 1, wherein the sidewall spacers are removed after formation of silicide in the semiconductor arrangement, the sidewall spacers defining offset of silicide from the gate electrode.

5. The method of claim 4, wherein the sidewall spacers are removed by wet etching.

6. The method of claim 4, wherein the sidewall spacers are removed by dry etching.

7. The method of claim 4, wherein the silicide is nickel silicide.

8. A method of manufacturing a semiconductor device, comprising the steps of:
- forming a gate electrode on a substrate;
- forming removable sidewall spacers on the gate electrode and the substrate;
- forming silicide on the substrate, the sidewall spacers defining an offset of the silicide from the gate electrode;
- removing the sidewall spacers to expose the substrate; and
- line-of-sight monitoring the exposed substrate to detect silicide encroachment.

9. The method of claim 8, wherein the line-of-sight monitoring is optical monitoring.

10. The method of claim 8, wherein the line-of-sight monitoring is electron microscope monitoring.

11. The method of claim 8, wherein the sidewall spacers are removed by wet etching.

12. The method of claim 8, wherein the sidewall spacers are removed by dry etching.

13. A method of monitoring a semiconductor arrangement, comprising the steps:
- forming silicide regions in a substrate, the silicide regions being offset from a gate electrode;
- exposing the substrate at regions adjacent to the gate electrode; and
- line-of-sight monitoring of the exposed substrate regions to determine an amount of offset of the silicide regions from the gate electrode.

14. The method of claim 13, wherein the forming of silicide regions includes forming sidewall spacers on the substrate and the gate electrode, the sidewall spacers defining a desired offset of the silicide regions from the gate electrode.

15. The method of claim 14, wherein the step of exposing the substrate includes removing the sidewall spacers.

16. The method of claim 15, wherein the line-of-sight monitoring is optical monitoring.

17. The method of claim 15, wherein the line-of-sight monitoring is electron microscope monitoring.

* * * * *